(12) United States Patent
Pawlowski

(10) Patent No.: US 7,324,401 B2
(45) Date of Patent: Jan. 29, 2008

(54) MEMORY DEVICE AND METHOD HAVING PROGRAMMABLE ADDRESS CONFIGURATIONS

(75) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/431,164

(22) Filed: May 9, 2006

(65) Prior Publication Data

US 2006/0203601 A1    Sep. 14, 2006

Related U.S. Application Data

(63) Continuation of application No. 10/920,716, filed on Aug. 16, 2004, now Pat. No. 7,151,709.

(51) Int. Cl.
    *G11C 8/00*    (2006.01)
(52) U.S. Cl. ............ 365/230.02; 365/189.02; 365/230.08
(58) Field of Classification Search ............ 365/230.02
    See application file for complete search history.

(56) References Cited

U.S. PATENT DOCUMENTS

| | | | | |
|---|---|---|---|---|
| 4,037,215 A | | 7/1977 | Birney et al. ............ 364/200 |
| 4,476,546 A | | 10/1984 | Varshney ................ 365/200 |
| 4,882,709 A | * | 11/1989 | Wyland ............... 365/189.02 |
| 5,005,157 A | * | 4/1991 | Catlin ................... 365/193 |
| 5,012,408 A | | 4/1991 | Conroy ................. 364/200 |
| 5,055,661 A | | 10/1991 | Gochi ................... 235/492 |
| 5,117,350 A | | 5/1992 | Parrish et al. ............ 395/425 |
| 5,241,510 A | * | 8/1993 | Kobayashi et al. .... 365/230.03 |
| 5,261,064 A | | 11/1993 | Wyland ................. 711/211 |
| 5,293,495 A | | 3/1994 | Nguyen et al. .......... 395/325 |
| 5,363,337 A | * | 11/1994 | Reinberg ............ 365/230.06 |
| 5,422,884 A | | 6/1995 | Göertz ................. 370/85.1 |
| 5,586,081 A | | 12/1996 | Mills et al. .......... 365/230.08 |
| 5,644,747 A | * | 7/1997 | Kusuda ................. 711/5 |
| 5,684,973 A | | 11/1997 | Sullivan et al. .......... 395/405 |
| 5,715,197 A | | 2/1998 | Nance et al. ........ 365/189.02 |
| 5,748,982 A | | 5/1998 | Smith et al. ............ 395/829 |
| 5,784,636 A | | 7/1998 | Rupp ................. 395/800.37 |
| 5,838,307 A | | 11/1998 | Bouton ................. 345/168 |
| 5,838,932 A | | 11/1998 | Alzien ................. 395/308 |
| 5,867,430 A | | 2/1999 | Chen et al. .......... 365/189.04 |
| 5,901,095 A | | 5/1999 | Crafts ................. 365/200 |
| RE36,229 E | * | 6/1999 | Cady .................. 711/211 |
| 5,918,026 A | | 6/1999 | Melo et al. ............ 395/308 |
| 5,954,812 A | | 9/1999 | Shiell et al. ............ 712/39 |
| 5,982,655 A | * | 11/1999 | Doyle ................. 365/63 |
| 5,982,696 A | | 11/1999 | Rao ................. 365/230.03 |
| 6,026,465 A | | 2/2000 | Mills et al. ............ 711/103 |

(Continued)

*Primary Examiner*—Son L. Mai
(74) *Attorney, Agent, or Firm*—Dorsey & Whitney, LLP

(57) ABSTRACT

A memory device includes a configurable address register having a first set of input buffers coupled to a first set on address bus terminals and a second set of input buffers coupled to a second set of address bus terminals. In a first addressing configuration, address signals are simultaneously applied to the address bus terminals in the first and second sets, and they are simultaneously stored in respective address registers. In a second addressing configuration, a plurality of sets of address signals are sequentially applied to the address bus terminals in only the first set of address bus terminals. Each set of address signals is then stored in a different address register.

88 Claims, 6 Drawing Sheets

U.S. PATENT DOCUMENTS

| | | | |
|---|---|---|---|
| 6,091,645 A | 7/2000 | Iadanza | 365/189.02 |
| 6,108,251 A | 8/2000 | Manning | 365/200 |
| 6,118,707 A | 9/2000 | Gould et al. | 365/189.08 |
| 6,150,839 A | 11/2000 | New et al. | 326/40 |
| 6,154,825 A * | 11/2000 | Murdoch et al. | 711/211 |
| 6,163,836 A | 12/2000 | Dowling | 712/37 |
| 6,178,132 B1 | 1/2001 | Chen et al. | 365/230.02 |
| 6,205,497 B1 | 3/2001 | Hamilton et al. | 710/9 |
| 6,211,891 B1 | 4/2001 | Wahlig | 345/521 |
| 6,229,727 B1 * | 5/2001 | Doyle | 365/63 |
| 6,249,480 B1 | 6/2001 | Mick | 365/233 |
| 6,326,807 B1 | 12/2001 | Veenstra et al. | 326/40 |
| 6,356,991 B1 | 3/2002 | Bauman et al. | 711/209 |
| 6,388,930 B1 | 5/2002 | Obremski | 365/201 |
| 6,393,545 B1 | 5/2002 | Long et al. | 712/34 |
| 6,401,139 B1 | 6/2002 | Hamilton et al. | 710/9 |
| 6,425,066 B1 | 7/2002 | Moreaux et al. | 711/212 |
| 6,466,825 B1 | 10/2002 | Wang et al. | 700/5 |
| 6,484,227 B1 | 11/2002 | Mergard et al. | 711/1 |
| 6,496,403 B2 * | 12/2002 | Noda et al. | 365/63 |
| 6,505,313 B1 | 1/2003 | Phan et al. | 714/718 |
| 6,507,898 B1 | 1/2003 | Gibson et al. | 711/168 |
| 6,519,690 B1 | 2/2003 | Quimby | 711/202 |
| 6,587,394 B2 | 7/2003 | Hogan | 365/230.06 |
| 6,594,735 B1 | 7/2003 | Baker et al. | 711/147 |
| 6,611,466 B2 | 8/2003 | Lee et al. | 365/200 |
| 6,684,314 B1 | 1/2004 | Manter | 711/200 |
| 6,700,821 B2 | 3/2004 | Forbes et al. | 365/189.01 |
| 6,721,223 B2 * | 4/2004 | Matsumoto et al. | 365/222 |
| 6,754,779 B1 | 6/2004 | Magro | 711/137 |
| 6,760,872 B2 | 7/2004 | Gupta et al. | 714/719 |
| 6,769,046 B2 | 7/2004 | Adams et al. | 710/316 |
| 6,823,505 B1 | 11/2004 | Dowling | 717/140 |
| 6,938,142 B2 | 8/2005 | Pawlowski | 711/167 |
| 7,002,868 B2 | 2/2006 | Takahashi | 365/222 |

* cited by examiner

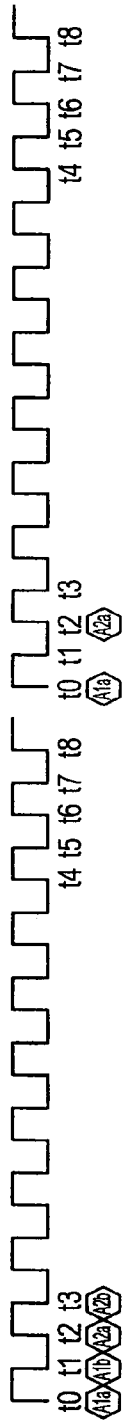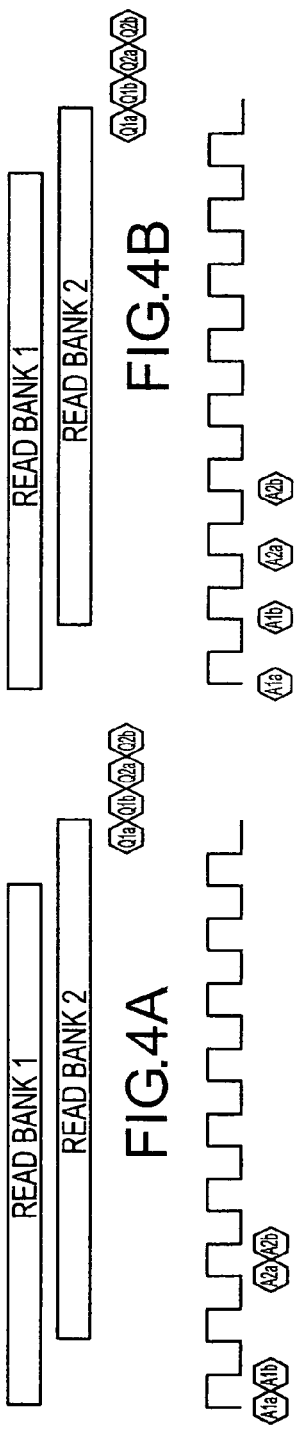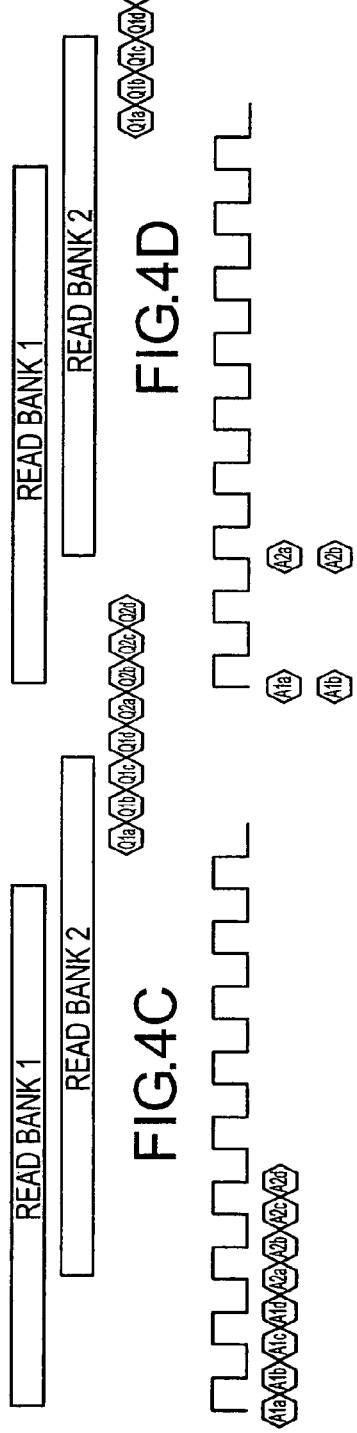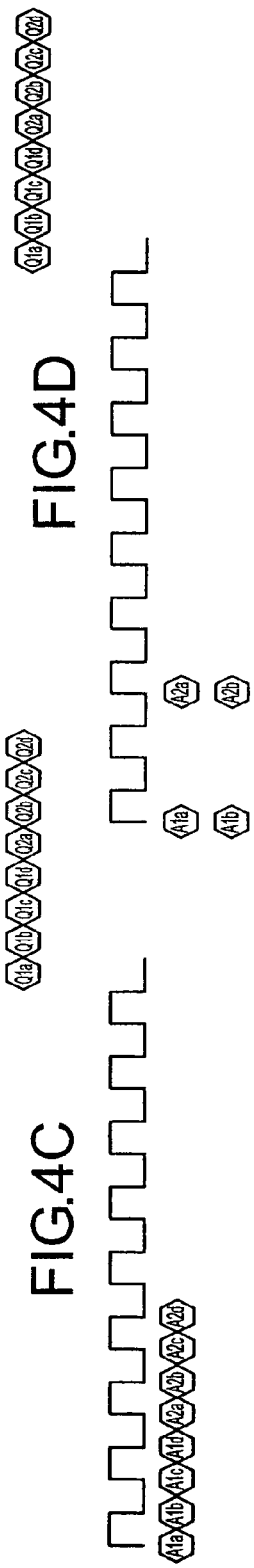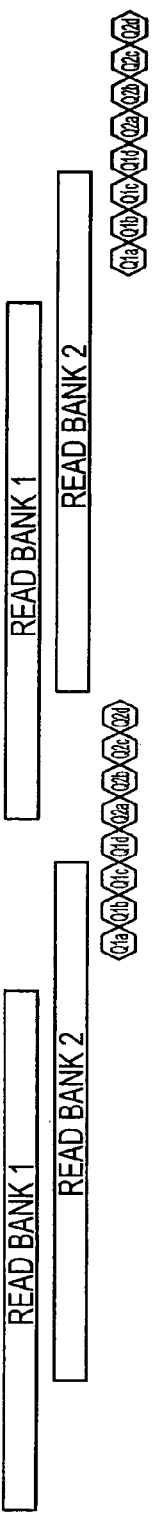
FIG.4A  FIG.4B  FIG.4C  FIG.4D  FIG.4E  FIG.4F

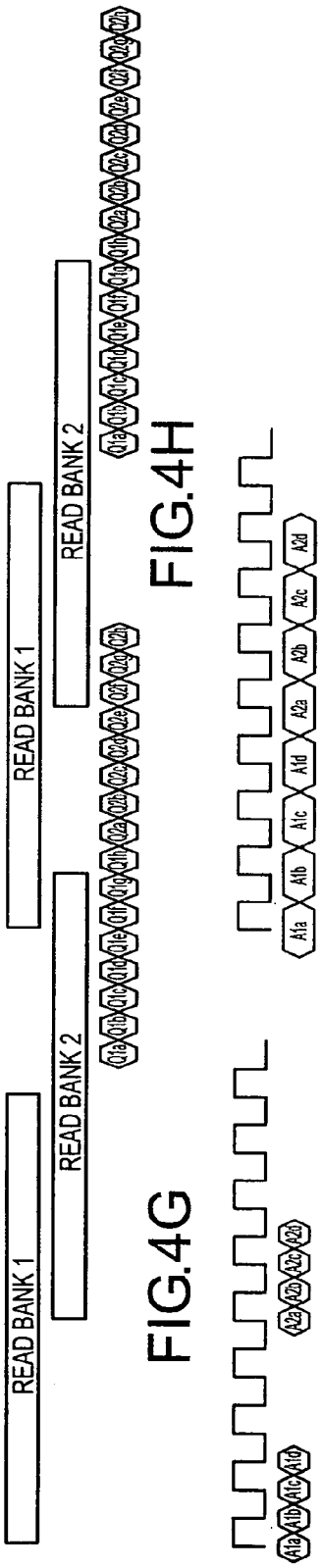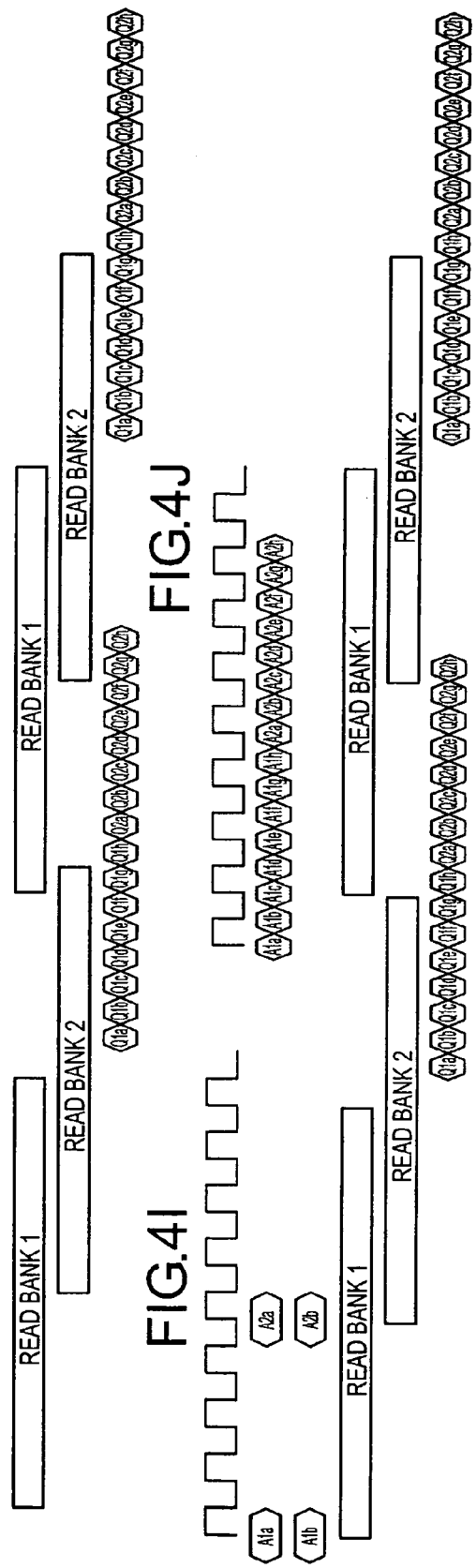

MEMORY DEVICE AND METHOD HAVING PROGRAMMABLE ADDRESS CONFIGURATIONS

CROSS-REFERENCE TO RELATED APPLICATION

This application is a continuation of U.S. patent application Ser. No. 10/920,716, filed Aug. 16, 2004, U.S. Pat. No. 7,151,709.

TECHNICAL FIELD

This invention relates to memory devices, and, more particularly, to a method and application for easily and quickly adapting synchronous memory devices to a wide variety of addressing configurations.

BACKGROUND OF THE INVENTION

A wide variety of memory devices are in common use. Common types of memory device are random access memory ("RAM") devices, which are generally either static random access memory ("SRAM") devices or dynamic random access memory ("DRAM") devices. Either of these types of RAM devices can operate synchronously with a clock signal. For example, in a synchronous dynamic random access memory ("SDRAM") device, command, address, and write data signals are applied to a synchronous dynamic random access memory ("SDRAM") device and are registered on one or both transitions of a clock signal. In practice, the address signals are commonly divided into bank address signals, row address signals, and column address signals. These address signals are generally applied to the SDRAM device through an address bus. The row address signals are applied to the SDRAM device prior to applying the column address signals to the SDRAM device. The bank address signals are generally applied to the SDRAM device along with the row address signals, although they may alternatively be applied to the SDRAM device at other times.

The SDRAM device responds to the command signals and address signals by performing a memory access operations, such as by storing write data in the SDRAM or by coupling read data from the SDRAM. As mentioned above, the write data signals are normally registered in the SDRAM in synchronism with either the clock signal or a write data strobe signal that is derived from the clock signal. Similarly, read data signals are output from the SDRAM in synchronism with either the clock signal or a read data strobe signal that may also be derived from the clock signal.

The timing relationship between the address signals and the data signals vary as a function of the operating mode of the SDRAM device. A set of bank and row address signals and a set of column address signals may be required for each set of read data signals or write data signals. If the data signals are coupled to or from the SDRAM on each rising edge of the clock signal, then it will be necessary to apply one of the two sets of address signals to the SDRAM on both the rising and falling edge of the clock signal to provide maximum data bandwidth. However, the if data signals may be multiplexed so that half of the data signals are coupled to or from the SDRAM on a first rising edge of the clock signal and the other half of the data signals are coupled to or from the SDRAM on the next rising edge of the clock signal. In such case, the maximum data bandwidth can be achieved by applying one of the two sets of address signals to the SDRAM on only the adjacent rising edges of the clock signal. Other relationships between the timing of the data signals and the timing of the address signals can also be used.

The timing relationship between the data signals and the address signals is also affected by whether the SDRAM device is operating in a "burst" mode. In a burst mode, a set of bank/row address signals and a set of column address signals define a starting address for a read or write operation. Data are then coupled to or from the SDRAM device in synchronism with a number of cycles of the clock signal. For example, in a "burst 4" mode, 4 sets of write data are coupled to or read data are coupled from an SDRAM device responsive to the set of bank/row address signals and a set of column address signals. If data signals are coupled to or from the SDRAM on each transition of the clock signal, i.e., on both the rising edge and the falling edge, the maximum data bandwidth can be achieved in the burst 4 mode by applying the bank/row address signals to the SDRAM on the first rising edge of the clock signal and the column address signals can be applied to the SDRAM on the next rising edge of the clock signal. Similar timing relationships between the address signals and the data signals exist for operations in other burst modes, such as the burst 2 or burst 8 mode.

The timing relationship between the address signals and the data signals vary as a function of the manner in which the address signals are coupled to the SDRAM. The address signals for a bank address, a row address and a column address may be coupled to the SDRAM at the same time by using an address bus having a larger number of address bits. The received address signals can them be multiplexed into bank address signals, row address signals and column address signals in the SDRAM. However, a very wide address bus is undesirable for a number of reasons. A narrower address bus is preferable, but a narrower address bus requires that the SDRAM process addresses at a faster speed for the same addressing rate.

The burst mode, as well as the number of data bits that will be coupled to or from the SDRAM with each burst, can be selected by appropriate command signals coupled to the SDRAM. However, the size of the address bus and the manner in which the addresses are applied to the SDRAM do not normally vary during operation of a system using the SDRAM. As a result, different SDRAM devices must be manufactured and sold to meet the requirements of customers using the SDRAM devices in electronic systems. It is relatively expensive to design and manufacture a wide variety of SDRAM devices having respective addressing configurations. It is also relatively expensive for venders of SDRAM devices to stock a wide variety of SDRAM devices having respective addressing configurations. As a result, the wide variety of SDRAM devices that are demanded by customers is a significant component of the price of SDRAM devices. Similar factors also increase the price of other types of memory devices, such as SRAM devices.

There is therefore a need for memory device and method that can be easily and quickly adapted to a wide variety of addressing configurations so that it is only necessary to manufacture and sell a single memory device to suit a wide variety of customer needs.

SUMMARY OF THE INVENTION

A memory device and method includes a configurable address buffer that can be programmed to cause the memory device to operate in a variety of addressing configurations. In particular, the address buffer can be configured to operate with various address bus widths, to vary the number and timing of various sets of address signals that are coupled to the memory device through the address bus, and to vary the timing at which these address signals are coupled to the memory device.

BRIEF DESCRIPTION OF THE DRAWINGS

FIGS. 4A-4L are timing diagrams showing respective address configuration modes in various embodiments of the present invention.

DETAILED DESCRIPTION

Figure 1:
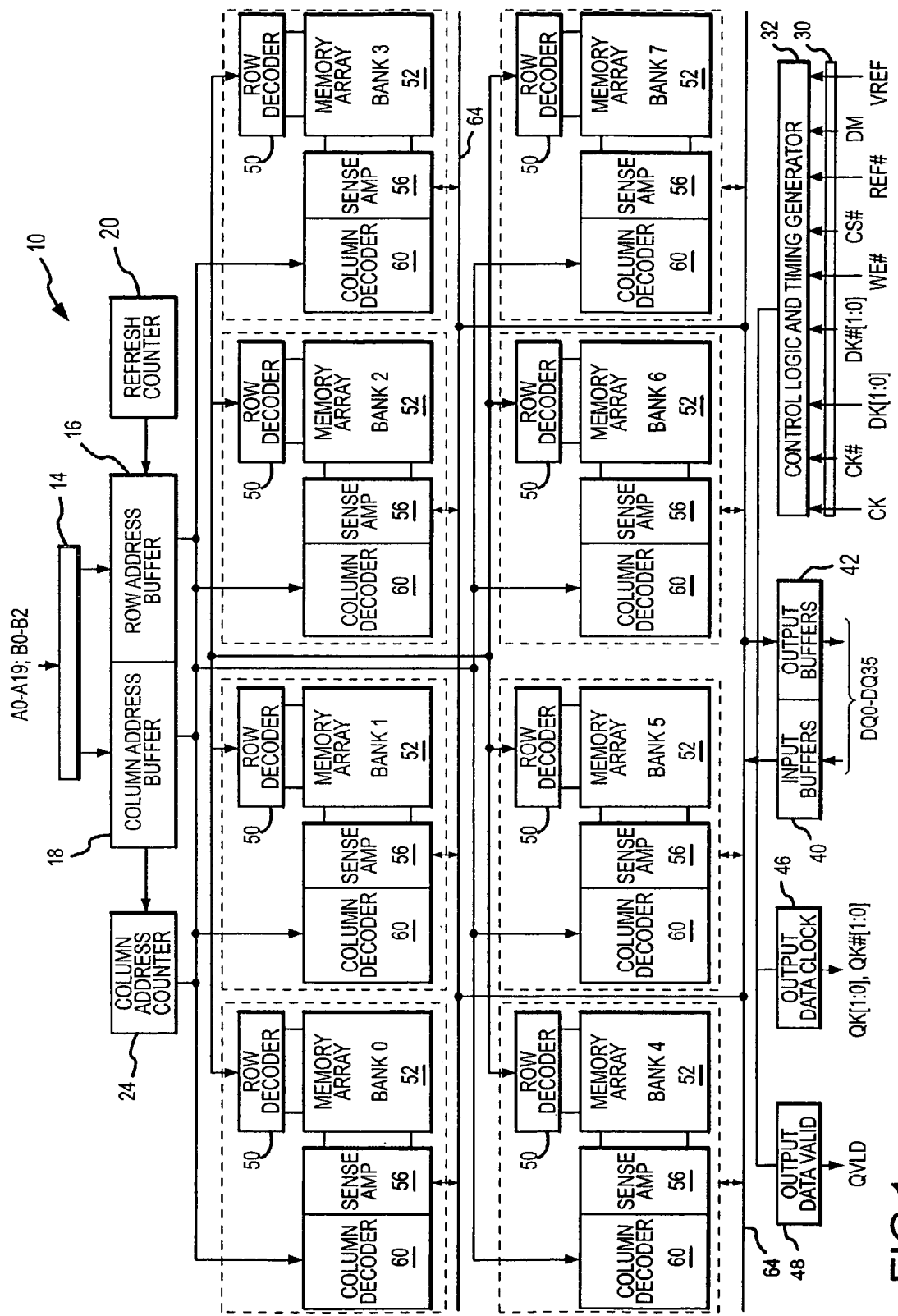
FIG. 1 is a memory device according to one embodiment of the invention.

A memory device 10 according to one embodiment of the present invention is shown in FIG. 1. The memory device a plurality of configurable address buffers 14, which, in the example shown in FIG. 1, includes 20 row/column address buffers and 3 bank address buffers. Row/column address signals are coupled to the address buffers 14 through an address bus (not shown in FIG. 1), and the address buffers 14 then apply these address signals to either a row address buffer 16 or a column address buffer 18. As explained in greater detail below, the manner in which the configurable address buffers 14 couple address signals from the address-bus to the row and column address buffers 16, 18, respectively, can be varied. However, regardless of how address signals are applied to the memory device 10, the address buffers 14 collectively couple 20 bits of row/column address signals to the row address buffer 16 and the column address buffer 18 in the memory device example shown in FIG. 1.

Address signals can also be coupled to the row address buffer 16 by a refresh counter 20, which generates the row address signals for refresh operations in the event the memory device 10 is a dynamic random access memory ("DRAM") device or other memory device in which the memory cells must be refreshed. Column address signals can also be generated by a column address counter 24 for burst operating modes. In a burst operating mode, an initial column address is designated by column address signals received through the address bus. Thereafter, the column address counter 24 generates a sequence of column address signals corresponding to a predetermined plurality of column addresses incrementing from the initial column address.

The memory device 10 also includes a set of command buffers 30 that receive memory command signals through a command bus. These command signals for the memory device example shown in FIG. 1 are complementary clock CK, CK# signals that control the timing at which operations in the memory device 10 occur, complementary 2-bit input data clock DK[1:0], DK#[1:0] signals that are used to synchronously clock read data into the memory device 10, a write enable WE# signal that is active low for a write operation, an active low REF# signal that selects an auto refresh mode, a data mask DM signal that is used to mask data transfers to and from the memory device for certain storage locations of the memory device 10, and a reference voltage VREF that sets a reference level for the command buffers 30 as well as other input buffers, which are described below. Insofar as these command signals are somewhat peripheral to the present invention, their nature and functions generally will not be described in the interests of brevity. The command buffers 30 apply the command signals to a control logic and timing generator 32, which generates various control signals to control the operation of the memory device 10.

The memory device 10 also includes a plurality of data input buffers 40 that receive write data signals from a data bus (not shown in FIG. 1), and data output buffers 42 that couple read data signals to the data bus. In the memory device example shown in FIG. 1, the data bus couples 36 bits of data signals DQ0-DQ35 to and from the memory device 10. Also included in the memory device 10 are output data clock buffers 46 that output complementary 2-bit output data clock QK[1:0], QK#[1:0] signals. Finally, the memory device 10 includes a output data valid buffer 48 that outputs data valid signal QVLD when valid read data is being applied to the data bus terminals.

In operation, the row address buffer 16 couples the row address signals from the configurable address buffer 14 or the refresh counter 20 to a plurality of row decoders 50. One row decoder 50 is provided for each of a plurality of memory banks 52. As is well known to one skilled in the art, each memory bank 52 includes a large number of memory cells, such as DRAM memory cells, that are arranged in rows and columns. The bank address signals designate the particular bank that will be accessed. A particular row of memory cells in that bank that will be accessed for a write or read operation is designated by the row address signals. The particular memory cell in that row that will be accessed is designated by the column address signals. After the row decoder 50 for the active memory bank 52 decodes the row address signals from the row address buffer 16, it activates a word line (not shown) for the corresponding row of memory cells in the bank 52. In response, a set of sense amplifiers 56 in the bank 52 corresponding to the bank address determines and then outputs the binary value stored in each memory cell in the active row. As shown in FIG. 1, one set of sense amplifiers 56 is provided for each memory bank 52, although in other embodiments, the sense amplifiers 56 may be shared by two or more memory banks. Each of the sense amplifiers 56 couples a data signal from a respective column of memory cells.

The column address buffer 18 couples the column address signals from the configurable address buffer 14 or the column address counter 24 to a plurality of column decoders 60, one of which is provided for each bank 52. The output of the sense amplifier 56 for the column corresponding to the decoded column address is then coupled through a data path 64 to the data output buffers 42. Write data signals from the input buffers 40 are also coupled through the data path 64 to write drivers in the sense amplifiers 56. The write drivers couple the write data signals to memory cells in an active row designated by the decoded column address signals.

Figure 2:
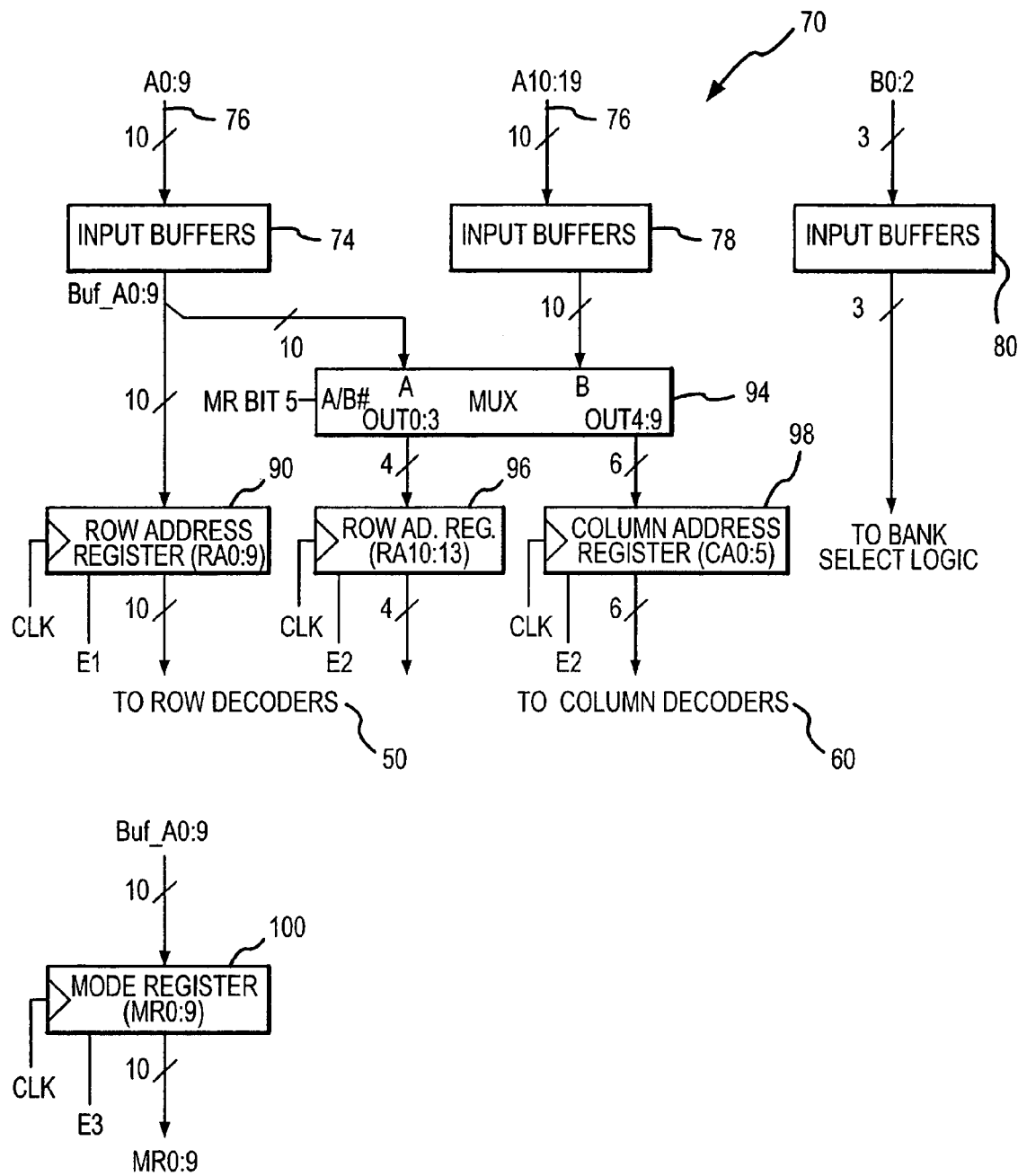
FIG. 2 is a block diagram of a configurable address buffer according to one embodiment of the invention that can be used in the memory device of FIG. 1.

As mentioned above, the address buffer 14 receives address signals through the address bus in various configurations, and it reconfigures these address signals to collectively couple 20 row and column addresses to the row address buffer 16 and the column address buffer 18. One embodiment of a configurable address buffer 70 that reconfigures address signals in this manner is shown in FIG. 2. The configurable address buffer 70 includes a first set of 10 input buffers 74 that are coupled to 10 respective bits A[0:9]

of an address bus 76, and a second set of 10 input buffers 78 that are coupled to 10 respective bits A[10:19] of the address bus 76. Finally, a set of 3 input buffers 80 receive 3 bits of bank address signals B[0:2], and couple them to bank select logic bank (not shown), which enables one of the 10 memory banks 52 (FIG. 1).

Address signals Buf_A[0:9] output from the first set of 10 input buffers 74 are coupled to both a first row address register 90 and a first input "A" port of a multiplexer 94. A second input port "B" of the multiplexer 94 is coupled to receive outputs from the second set of 10 input buffers 78. The multiplexer 94 couples the address signals for the first 4 bits applied to either the A input port or the B input port to a 4-bit row address register 96, and it is couples the address signals for the second 6 bits applied to either the A input port or the B input port to a 6-bit column address register 98. Thus, the row address registers 90, 96 collectively output a 14-bit row address, RA[0:9], RA[10:13], respectively, and the column address register outputs a 6-bit column address CA[0:5].

The multiplexer 94 and the address registers 90, 96, 98 operate in either of two modes. These modes are selected by a mode register 100 that is programmed by the 10 low order bits of the address signals Buf_A[0:9] from the input buffers 74. The mode register 100 is programmed by the address signals Buf_A[0:9] responsive to an internal clock CLK signal when an enable signal E3 is active high. The E3 signal is generated by the control logic and timing generator 32 responsive to decoding the CS#, REF#, and WE# command signals all being active low. The mode register 100 then outputs 10 bits of mode register signals MR[0:9] corresponding to the address signals Buf_A[0:9]. Most of the mode register signals MR[0:9] are used for purposes other than reconfiguring address signals. However, the mode register signal MR[5] for the sixth mode register bit is used for this purpose.

Although the mode register 100 is preferably used for selecting the address configuration of the configurable address buffer 70, it will be understood that other means may be used. For example, the address configuration could be set by programming fuses or anti-fuses in the memory device, by applying mode select signals to the memory device 10, or by some other means. Once the configuration of the address buffer 70 is selected and the memory device 10 is installed in a system, it is generally not necessary to change the addressing configuration. However, in some cases changing the addressing configuration may be desirable, and using the mode register 100 or externally applied mode select signals would facilitate such change.

In operation, when the MR[5] signal is low, the multiplexer 94 couples the "B" input port, which receives the address signals A[10:19] from the input buffers 78, to the row address register 96 and the column address register 94. The address signals A[10:13] are stored in the row address register 96, and the address signals A[14:19] are stored in the column address register 98 responsive to the CLK signal when the enable signal E2 is active high. At the same time, the address signals A[0:9] from the input buffers 74 are stored in the row address register 90 responsive to the CLK signal when the enable signal E1 is active high. The active high E1 and E2 signals are generated by the control logic and timing generator 32 (FIG. 1) when it decodes the CS# command signal as active low. Therefore, when the MR[5] signal is low, the configurable input buffer 70 simultaneously receives 20-bits of address signals A[0:19], which are used to generate 14 bits of row address signals stored in the row address registers 90, 96 and 6 bits of column address signals stored in the column address register 98. Thus, in this first configuration, the external address bus 76 has a 20-bit width. The bank address signals B[0:2] are also preferably applied to the input buffers 80 before or at the same time that the address signals A[0:19] are applied to the input buffers 74, 78.

When the MR[5] signal is low, the E1 and E2 enable signals are generated by decoding the CS# command signal as active low. However, when the MR[5] signal is high, the control logic and timing generator 32 (FIG. 1) generates an active high E1 signal responsive to the first CLK signal, and it generates an active high E2 signal responsive to the second CLK signal. The high MR[5] signal also causes the multiplexer 94 to couple the Buf_A[0:9] signals applied to the "A" input to the row address register 96 and the column address register 98. As a result, the address bus 76 may have a width of only 10 bits, although two sets of 10-bit address signals must be applied to the configurable input buffer 70 on successive CLK periods. More specifically, on a first transition (such as a rising edge) of the CLK signal, the A[0:9] address signals are coupled through the input buffers 74 and stored in the row address register 90 as row address signals RA[0:9] since the E1 signal is then high. The A[0:9] address signals from the input buffers 74 are also coupled to the output of the multiplexer 94 since the MR[5] signal is high. However, the A[0:9] address signals are not stored in the row address register 96 and the column address register 98 since the E2 signal is then low.

On a second transition (such as the next rising edge) of the CLK signal, the second set of address signals A[0:9] are coupled through the input buffers 74. However, the address signals A[0:9] are not stored in the row address register 90 since the control logic and timing generator 32 has transitioned the E1 signal low responsive to the CLK signal. The A[0:9] address signals from the input buffers 74 are again coupled to the output of the multiplexer 94 since the MR[5] signal is high. However, since the E2 signal is now active high, the 4 low-order bits of the A[0:9] address signals are stored in the row address register 96 as row address signals RA[10:13], and the 6 high-order bits of the A[0:9] address signals are stored in the column address register 96 as column address signals CA[0:5]. Therefore, when the MR[5] signal is high, the configurable input buffer 70 sequentially receives two 10-bit sets of address signals A[0:9], which are again used to generate 14 bits of row address signals stored in the row address registers 90, 96 and 6 bits of column address signals stored in the column address register 98. However, in this second configuration, the external address bus 76 has a width of only 10 bits. The bank address signals B[0:2] may be applied to the input buffers 80 at the same time that either of these sets of address signals A[0:9] are applied to the input buffers 74.

The number of bits in the first set of address signals A[0:9] is preferably the same as the number of bits in the second set of address signals A[0:9] so that the entire address bus is used completely for both sets. However, the number of bits in the first and second sets of address signals A[0:9] need not be the same. For example, a 12-bit row address and a 4-bit column address could be generated by coupling 10 bits of address signals A[0:9] through the address bit during the first CLK period and 6 bits of address signals A[0:5] through the address bit during the second CLK period. Also, although the address signals A[0:9] are preferably applied to the configurable address buffer 70 on successive rising edge of the CLK signal, they may be applied to the buffer 70 at other times, such as on a consecutive transitions of the CLK signal, i.e., the rising edge of the CLK signal and the subsequent falling edge of the CLK signal. Other variations are, of course, possible.

Figure 3A:
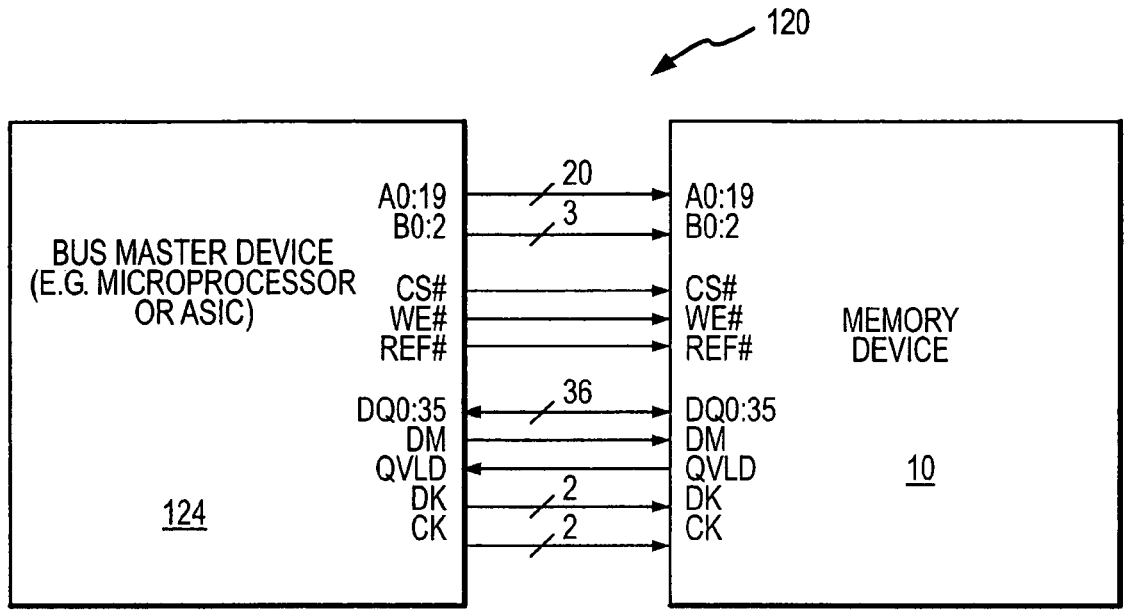
FIGS. 3A and 3B are block diagrams of memory systems using the memory device of FIG. 1 in which the memory device operates in either of two modes.
Figure 3B:
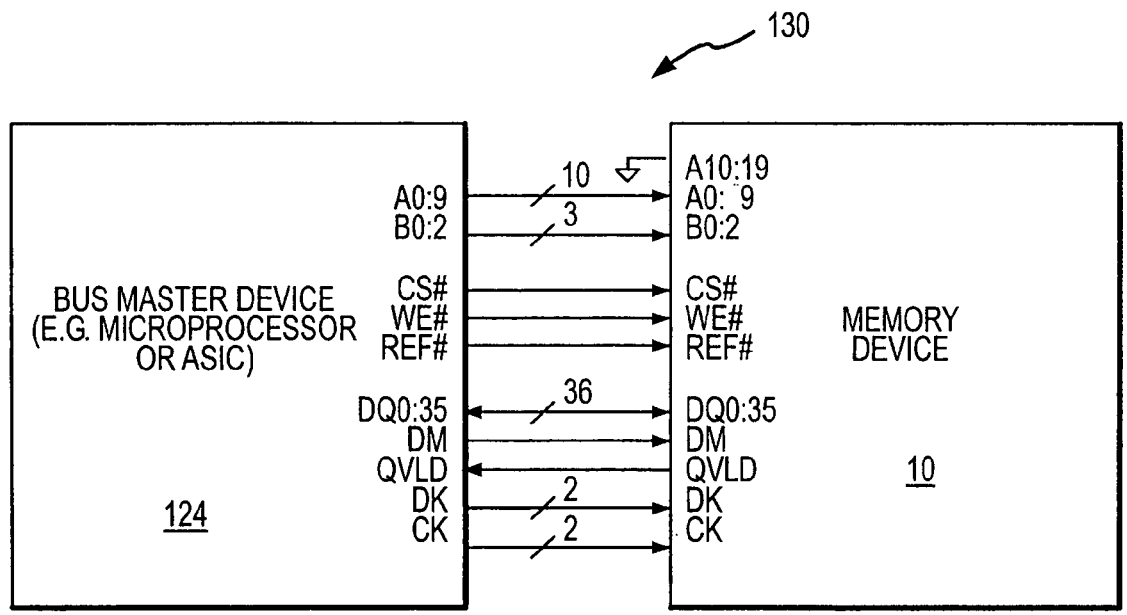

Memory systems 120, 130, respectively, using the memory device 10 of FIG. 1 in the first and second modes, respectively, are shown in FIG. 3A and 3B. With reference first to FIG. 3A, the memory system 120 includes a memory device 10 coupled to a bus master device 124, such as a microprocessor, through several sets of buses and signal lines. These buses and signal lines include a 20-bit row/column address bus A[0:19], a 3-bit bank address bus B[0:2], a CS# signal line, a WE# signal line, a REF# signal line, a 36-bit data bus DQ[0:35], a DM signal line, a QVLD signal line, a DK signal line, and a CLK signal line. Thus, the memory system 120 is structured for the memory device 10 to operate in the first configuration in which a 20-bit address bus is used.

With reference to FIG. 3B, the memory system 130 differs from the memory system 120 by using an address bus A[0:9] having a width of only 10 bits. The unused address bus terminals A[10:19] of the memory device 10 are preferably coupled to ground so that the input buffers 78 (FIG. 2) do not waste power responding to transitions of signals coupled to the address bus terminals A[10:19]. Thus, the memory system 130 is structured for the memory device 10 to operate in the second mode described above with reference to FIG. 2.

The ability to configure the address input buffer 70 to operate with either a 10-bit address bus or a 20-bit address bus may provide several advantages. First, allowing the width of the address bus to be reduced provides a corresponding reduction in the number of externally accessible terminals of the device. The large number of terminals that result from ever increasing address and data bus widths can be a significant problem. Also, reducing the width of the address bus tends to maximize the usage of address bus terminals. Furthermore, it is necessary to design and manufacture as single memory device, but the memory device can be sold two customers having different needs as two different memory devices programmed to operate in the first and second configurations, respectively. Other potential advantages will be apparent to one skilled in the art.

The memory device 10 shown in FIG. 1, the configurable address buffer 70 shown in FIG. 2, and the memory systems 120, 130 shown in FIGS. 3A and 3B, respectively use an address bus having a width of either 10 bits or 20 bits, depending on the addressing configuration, and they generate a 14 bits of row address signals and 6 bits of column address signals. However, a large variety of other addressing configurations are possible, some of which are shown in timing diagrams of FIGS. 4A-4L. In all of these timing diagrams, a CLK signal, sets of address signals, internal data read operations, and sets of read data signals are shown from top-to-bottom of the FIGS. 4A-4L.

With reference to FIG. 4A, a first set of address signals A1$a$ are applied to a memory device on the first rising edge of the CLK signal at time $t_0$, and a second set of address signals A1$b$ are applied to the memory device on the first falling edge of the CLK signal at time $t_1$. These two sets of address signals are used to initiate a burst read operation having a-burst length of two. Address signals A2$a$, A2$b$ for a second read operation having a burst length of two are applied to the memory device at times $t_2$ and $t_3$, respectively. From time $t_0$ to time $t_4$ the first read operation is being processed with a latency of 8 periods of the CLK signal. Similarly, from time $t_2$ to time $t_6$ the second read operation is being processed, also with a latency of 8 periods of the CLK signal. The read operations can be processed concurrently because they are directed to different memory banks 52 (FIG. 1). At time $t_5$, a first set of read data signals Q1$a$ from the first read operation are applied to the data bus, and at time $t_6$, a second set of read data signals Q1$b$ are applied to the data bus. Similarly, read data signals Q2$a$, Q2$b$ from the second read operation are applied to the data bus at times $t_7$, $t_8$, respectively. Thus, FIG. 4A shows the memory device 10 operating in the second operating mode described above with respect to FIGS. 2 and 3.

FIG. 4B shows the memory device 10 operating in the first operating mode described above with respect to FIGS. 2 and 3. More specifically, first and second sets of address signals A1$a$, A1$b$ for a first memory read operation with a burst length of two are applied to a memory device 10 on the first rising edge of the CLK signal at time $t_0$. First and second sets of address signals A2$a$, A2$b$ for a second memory read operation with a burst length of two are applied to a memory device 10 on the next rising edge of the CLK signal at time $t_3$. The remainder of the read operation are the same as in the example of FIG. 4A except for the read latency. The read latency is lower for the example shown in FIG. 4B because all of the address signals for each read operation are received at the same time rather than at two different transitions of the CLK signal as in the Example of FIG. 4A. Comparing these two examples further, the example of FIG. 4A requires an address bus that operates at twice the speed of the address bus used in the example of FIG. 4B, but the width of the address bus used in the example of FIG. 4A is only half the width of the address bus used in the example of FIG. 4B.

The remaining FIGS. 4C-4L show the same signals and format used in FIGS. 4A, 4B for different operating modes. Therefore, in the interest of brevity, the characteristics of these modes are explained in the following Table 1. In any of these modes, the number of bits in each set of address signals can be any number desired, and the number of bits in each set for the same memory access need not be identical to each other. In all cases except otherwise noted, it is assumed that more than half of the address signals are needed to generate row addresses so that a row address cannot be decoded until over half of address signals have been received. The manner in which in would be necessary to adapt input buffers to perform the modes summarized in Table 1 will be apparent to one skilled in the art based on the example shown in FIG. 2.

TABLE 1

| FIG. | BURST LENGTH | MUX'D ADDRESS? | BUS WIDTH | BUS SPEED | ADDR SPACING | LATENCY | COMMENT |
|---|---|---|---|---|---|---|---|
| 4A | 2 | Yes-2s | N/2 | F | Adjacent | 17 | |
| 4B | 2 | No | N | F/2 | Spread | 16 | Lower Lat. because all addr. rec'd at same time |

TABLE 1-continued

| FIG. | BURST LENGTH | MUX'D ADDRESS? | WIDTH | BUS SPEED | ADDR SPACING | LATENCY | COMMENT |
|---|---|---|---|---|---|---|---|
| 4C | 4 | Yes-2 | N/2 | F | Adjacent | 17 | |
| 4D | 4 | Yes-2s | N/2 | F/2 | Spread | 18 | Higher Lat. because of spread addr. |
| 4E | 4 | Yes-4 | N/4 | F | Adjacent | 18 | Lat. of 18 only if all row addr. received in A__a–c - Otherwise 19 |
| 4F | 4 | No | N | F/4 | Spread | 16 | Lower Lat. because all addr. rec'd at same time |
| 4G | 8 | Yes-2 | N/2 | F | Adjacent | 17 | |
| 4H | 8 | Yes-2 | N/2 | F/2 | Adjacent | 18 | Long. addr. valid period, but causes higher lat. |
| 4I | 8 | Yes-4 | N/4 | F | Adjacent | 18 | Lat. of 18 only if all row addr. received in A__a–c - Otherwise 19 |
| 4J | 8 | Yes-4 | N/4 | F/2 | Adjacent | 20 | Long. addr. valid period, but causes higher lat. Lat. of 20 only if all row addr. received in A__a–c - Otherwise 22 |
| 4K | 8 | No | N | F/8 | Spread | 16 | Higher Burst Length allows lower F and greater spacing |
| 4L | 8 | Yes-8 | N/8 | F | Adjacent | 20 | Lat. of 20 only if all row addr. received in A__a–e - Otherwise higher |

The value of various embodiments of the invention should be readily apparent considering that the combinations of addressing configuration shown in FIGS. 4A-L and summarized in Table 1 are but a representative sample of all of the addressing configurations that are possible. Yet different memory devices offering each of these addressing configurations can be made available by manufacturing a single memory device and programming it to operate in these various addressing configurations.

Figure 5:
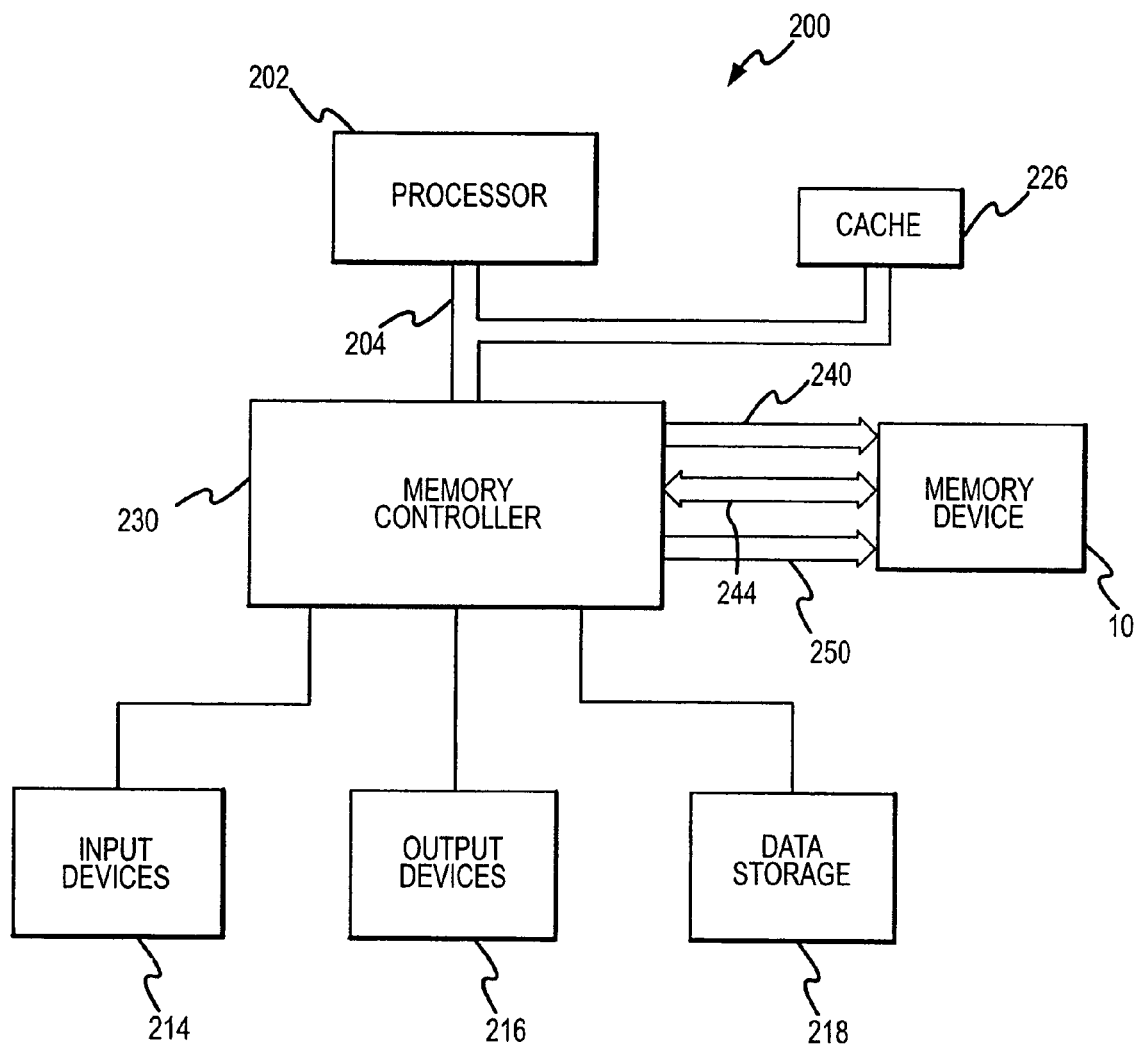
FIG. 5 is a block diagram of an embodiment of computer system using the memory device of FIG. 1.

FIG. 5 shows an embodiment of a computer system 200 that may use the memory device 10 or some other memory device that contains a configurable address buffer as described herein or some other example of a configurable address buffer in accordance with the present invention. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more mass data storage devices 218 are also typically coupled to the processor 202 to store data or retrieve data from external storage media (not shown). Examples of typical storage devices 218 include hard and floppy disks, tape cassettes, and compact disk read-only memories (CD-ROMs). The processor 202 is also typically coupled to a cache memory 226, which is usually static random access memory ("SRAM") and to the memory device 10 through a memory controller 230. The memory controller 230 includes a command bus 240 coupled to the command buffers 30 (FIG. 1) of the memory device 10, a data bus 244 coupled to the input data buffers 40 and output data buffers 42, as well as to the output data valid buffer 48 and the output data clock 46, and an address bus 250 coupled to the configurable address buffer 14. The memory controller 230 applies appropriate command signals to the memory device 10 to cause the memory device 10 to perform memory operations, such as read or write memory accesses. However, before the memory device 10 is installed in the computer system 200, it is programmed, such as by programming a mode register, to operate with a desired addressing configuration in accordance with various embodiments of the present invention.

Although the present invention has been described with reference to the disclosed embodiments, persons skilled in the art will recognize that changes may be made in form and detail without departing from the spirit and scope of the invention. For example, although the memory device 10 is a dynamic random access memory ("DRAM") device, it will be apparent that other types of memory devices may alternatively be used. Such modifications are well within the skill of those ordinarily skilled in the art. Accordingly, the invention is not limited except as by the appended claims.

I claim:

1. A configurable address buffer system operable to receive at least one set of address signals and output an address, the system comprising:

a configurable address buffer receiving the address signals, the configurable address buffer operable in a first addressing configuration to output the address utilizing one set of the address signals, the configurable address buffer further operable in a second addressing configuration to output the address utilizing two sets of the address signals; and an address configuration selector operable to couple a control signal to the configurable address buffer, the control signal causing the configurable address buffer to operate according to the first or the second addressing configuration.

2. The system of claim 1 wherein the address signals are coupled to the configurable address buffer through a bus, and wherein the address configuration selector is operable to develop the control signal as a function of a width of the bus.

3. The system of claim 2 wherein the control signal is indicative of the first addressing configuration when the bus has a first width and the second addressing configuration when the bus has a second width.

4. The system of claim 1, the configurable address buffer system operable to utilize a clock signal, and wherein the address signals in each of the sets in the second number are each received during successive clock periods.

5. The system of claim 1, the configurable address buffer system operable to utilize a clock signal, and wherein the address signals in each of the sets in the second number are received at successive clock transitions.

6. The system of claim 1 wherein the configurable address buffer further comprises:

a first decoder operable to receive address signals and output at least a portion of a row or column address;

a second decoder operable to receive address signals and output at least a portion of a row or column address; and an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders.

7. The system of claim 1 wherein the address configuration selector comprises a mode register.

8. The system of claim 1 wherein the address configuration selector comprises fuses.

9. The system of claim 1 wherein the address configuration selector comprises anti-fuses.

10. The system of claim 1 wherein the address configuration selector comprises an externally applied mode select signal.

11. A memory device comprising:

an addressable array of memory cells; and a configurable address buffer system coupled to the addressable array of memory cells, the configurable address buffer system operable to utilize a clock signal and to receive at least one set of address signals and output an address of a selected one of the memory cells, the configurable address buffer system comprising:

a configurable address buffer, the configurable address buffer operable in a first addressing configuration to output the address utilizing a first number of sets of the address signals, the configurable address buffer further operable in a second addressing configuration to output the address utilizing a second number of sets of the address signals, the address signals in each of the sets in the second number being received during successive clock periods; and an address configuration selector operable to couple a control signal to the configurable address buffer, the control signal causing the configurable address buffer to operate according to the first or the second addressing configuration.

12. The memory device of claim 11 wherein the addressable array of memory cells are arranged in rows and columns.

13. The memory device of claim 12 wherein the outputted address comprises a specified row and a specified column of the selected one of the memory cells.

14. The memory device of claim 11, wherein the address signals are coupled to the configurable address buffer through a bus, and wherein the address configuration selector is operable to develop the control signal as a function of a width of the bus.

15. The memory device of claim 14 wherein the control signal is indicative of the first addressing configuration when the bus has a first width and the second addressing configuration when the bus has a second width.

16. The memory device of claim 11 wherein the first number of sets is one set.

17. The memory device of claim 16 wherein the second number of sets is two sets.

18. The memory device of claim 11, the configurable address buffer system operable to utilize a clock signal, and wherein the address signals in each of the sets in the second number are received at successive clock transitions.

19. The memory device of claim 11 wherein the configurable address buffer further comprises:

a first decoder operable to receive address signals and output at least a portion of a row or column address;

a second decoder operable to receive address signals and output at least a portion of a row or column address; and an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders.

20. The memory device of claim 11 wherein the address configuration selector comprises a mode register.

21. The memory device of claim 11 wherein the address configuration selector comprises fuses.

22. The memory device of claim 11 wherein the address configuration selector comprises anti-fuses.

23. The memory device of claim 11 wherein the address configuration selector comprises an externally applied mode select signal.

24. The memory device of claim 11 wherein the memory cells comprise dynamic random access memory cells.

25. The memory device of claim 11 wherein the memory device further comprises a plurality of arrays of memory cells.

26. A computer system comprising:

a processor;

an input device coupled to the processor;

an output device coupled to the processor; and a memory device coupled to the processor, the memory device comprising:
  an addressable array of memory cells; and
  a configurable address buffer system coupled to the addressable array of memory cells, the configurable address buffer system operable to receive at least one set of address signals and output an address of a selected one of the memory cells, the configurable address buffer system comprising:
    a configurable address buffer receiving the address signals, the configurable address buffer operable in a first addressing configuration to output the address utilizing a first number of sets of the address signals, the configurable address buffer further operable in a second addressing configuration to output the address utilizing a second number of sets of the address signals; and
    one of a fuse and an anti-fuse operable to couple a control signal to the configurable address buffer, the control signal causing the configurable address buffer to operate according to the first or the second addressing configuration.

27. The computer system of claim 26 wherein the processor, input device, output device, and memory device are coupled through a processor bus.

28. The computer system of claim 26 wherein the addressable array of memory cells are arranged in rows and columns.

29. The computer system of claim 28 wherein the outputted address comprises a specified row and a specified column of the selected one of the memory cells.

30. The computer system of claim 26, wherein the address signals are coupled to the configurable address buffer through a bus, and wherein the address configuration selector is operable to develop the control signal as a function of a width of the bus.

31. The computer system of claim 30 wherein the control signal is indicative of the first addressing configuration when the bus has a first width and the second addressing configuration when the bus has a second width.

32. The computer system of claim 26 wherein the first number of sets is one set.

33. The computer system of claim 32 wherein the second number of sets is two sets.

34. The computer system of claim 26, the configurable address buffer system operable to utilize a clock signal, and wherein the address signals in each of the sets in the second number are each received during successive clock periods.

35. The computer system of claim 26, the configurable address buffer system operable to utilize a clock signal, and wherein the address signals in each of the sets in the second number are received at successive clock transitions.

36. The computer system of claim 26 wherein the configurable address buffer further comprises:
  a first decoder operable to receive address signals and output at least a portion of a row or column address;
  a second decoder operable to receive address signals and output at least a portion of a row or column address; and
  an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders.

37. The computer system of claim 26 wherein the address configuration selector comprises a mode register.

38. The computer system of claim 26 wherein the address configuration selector comprises an externally applied mode select signal.

39. The computer system of claim 26 wherein the memory cells comprise dynamic random access memory cells.

40. The computer system of claim 26 wherein the memory device further comprises a plurality of arrays of memory cells.

41. A method of customizing a configurable address buffer system for addressing a memory device comprising:
  coupling a control signal to the address buffer system to select a first or second addressing configuration;
  in the first addressing configuration, sequentially applying a first group of address signals to an address bus responsive to a first transition of a clock signal and a second group of address signals to the address bus responsive to a second transition of the clock signal; and
  in a second addressing configuration, simultaneously applying the first group of address signals and the second group of address signals to the address bus responsive to the first transition of the clock signal.

42. The method of claim 41 wherein the first and second transitions of the clock signal comprises a first rising edge and a first falling edge that is immediately adjacent to the first rising edge.

43. The method of claim 41 wherein the first and second transitions of the clock signal comprises a first rising edge and a second rising edge respectively.

44. The method of claim 41 wherein the first and second transitions of the clock signal comprises spacing a second transition of the clock signal by a predetermined factor of clock periods relative to a first transition of the clock signal.

45. The method of claim 41 wherein the control signal further comprises selecting the first or second addressing configuration based on selecting a bandwidth size.

46. The method of claim 41 further comprising:
  processing a first read operation from the first and second group of address signals to output an address; and
  processing a second read operation from a second and third group of address signals in either the first or second addressing configuration, the second read operation being processed concurrently with the first read operation.

47. The method of claim 46 wherein processing the first and second read operations further comprises processing a read operation having a burst length of two.

48. The method of claim 46 further comprising spacing the first and second group of address signals of the first read operation by a predetermined factor of clock periods relative to the third and fourth group of address signals of the second read operation.

49. The method of claim 41 wherein the act of sequentially applying the groups of address signals in the first configuration comprises applying N address signals through N bits of an address bus, and wherein the act of simultaneously applying the groups of address signals in the second configuration comprises applying M sets of N/M address signals through N/M bits of the address bus.

50. A method of addressing a memory device comprising:
in a first addressing configuration, applying a first group of address signals to the memory device responsive to a first transition of a clock signal and applying a second group of address signals to the memory device responsive to a second transition of the clock signal; and
in a second addressing configuration, simultaneously applying the first group of address signals and the second group of address signals to the memory device responsive to the first transition of the clock signal in a manner that causes the time period for addressing the groups of address signals in the second address configuration to be different relative to the time period for addressing the groups of address signals in the first address configuration.

51. The method of claim 50 wherein the time period for addressing the group of signals in the second configuration is less than the time period for addressing the group of signals in the first configuration.

52. The method of claim 50 wherein the first and second transitions of the clock signal comprises a first rising edge and a first falling edge that is immediately adjacent to the first rising edge.

53. The method of claim 50 wherein the first and second transitions of the clock signal comprises a first rising edge and a second rising edge respectively.

54. The method of claim 50 wherein the first and second transitions of the clock signal comprises spacing a second transition of the clock signal by a predetermined factor of clock periods relative to a first transition of the clock signal.

55. The method of claim 50 further comprising:
processing a first read operation from the first and second group of address signals to output an address; and
processing a second read operation from a second and third group of address signals in either the first or second addressing configuration, the second read operation being processed concurrently with the first read operation.

56. The method of claim 55 wherein processing the first and second read operations further comprises processing a read operation having a burst length of two.

57. The method of claim 55 further comprising spacing the first and second group of address signals of the first read operation by a predetermined factor of clock periods relative to the third and fourth group of address signals of the second read operation.

58. The method of claim 50 wherein the act of applying the groups of address signals in the first configuration comprises applying N address signals through N bits of an address bus, and wherein the act of simultaneously applying the groups of address signals in the second configuration comprises applying M sets of N/M address signals through N/M bits of the address bus.

59. A method of addressing a memory device comprising:
in a first addressing configuration, applying a first group of address signals to an address bus responsive to a first transition of a clock signal and applying a second group of address signals to the address bus responsive to a second transition of the clock signal; and
in a second addressing configuration, simultaneously applying the first group of address signals and the second group of address signals to the address bus responsive to the first transition of the clock signal in a manner such that a bandwidth size for the address bus utilized in the second addressing configuration is different from a bandwidth size for the address bus utilized in the first address configuration.

60. The method of claim 59 wherein the bandwidth size for addressing the group of signals to the address bus in the second configuration is less than the bandwidth size for addressing the group of signals to the address bus in the first configuration.

61. The method of claim 59 wherein the first and second transitions of the clock signal comprises a first rising edge and a first falling edge that is immediately adjacent to the first rising edge.

62. The method of claim 59 wherein the first and second transitions of the clock signal comprises a first rising edge and a second rising edge respectively.

63. The method of claim 59 wherein the first and second transitions of the clock signal comprises spacing a second transition of the clock signal by a predetermined factor of clock periods relative to a first transition of the clock signal.

64. The method of claim 59 further comprising:
processing a first read operation from the first and second group of address signals to output an address; and
processing a second read operation from a second and third group of address signals in either the first or second addressing configuration, the second read operation being processed concurrently with the first read operation.

65. The method of claim 64 wherein processing the first and second read operations further comprises processing a read operation having a burst length of two.

66. The method of claim 64 further comprising spacing the first and second group of address signals of the first read operation by a predetermined factor of clock periods relative to the third and fourth group of address signals of the second read operation.

67. The method of claim 59 wherein the act of applying the groups of address signals in the first configuration comprises applying N address signals through N bits of an address bus, and wherein the act of simultaneously applying the groups of address signals in the second configuration comprises applying M sets of N/M address signals through N/M bits of the address bus.

68. A configurable address buffer system operable to utilize a clock signal and to receive at least one set of address signals and output an address, the system comprising:
a configurable address buffer receiving the address signals, the configurable address buffer operable in a first addressing configuration to output the address utilizing a first number of sets of the address signals, the configurable address buffer further operable in a second addressing configuration to output the address utilizing a second number of sets of the address signals, the address signals in each of the sets in the second number being received during successive clock periods; and
an address configuration selector operable to couple a control signal to the configurable address buffer, the control signal causing the configurable address buffer to operate according to the first or the second addressing configuration.

69. The system of claim 68 wherein the address signals are coupled to the configurable address buffer through a bus, and wherein the address configuration selector is operable to develop the control signal as a function of a width of the bus.

70. The system of claim 68 wherein the configurable address buffer further comprises:
a first decoder operable to receive address signals and output at least a portion of a row or column address;
a second decoder operable to receive address signals and output at least a portion of a row or column address; and an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders.

71. A configurable address buffer system operable to receive at least one set of address signals and output an address, the system comprising:
   a configurable address buffer receiving the address signals, the configurable address buffer operable in a first addressing configuration to output the address utilizing a first number of sets of the address signals, the configurable address buffer further operable in a second addressing configuration to output the address utilizing a second number of sets of the address signals, the configurable address buffer comprising:
      a first decoder operable to receive address signals and output at least a portion of a row or column address;
      a second decoder operable to receive address signals and output at least a portion of a row or column address; and
      an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders; and
   an address configuration selector operable to couple a control signal to the configurable address buffer, the control signal causing the configurable address buffer to operate according to the first or the second addressing configuration.

72. A configurable address buffer system operable to receive at least one set of address signals and output an address, the system comprising:
   a configurable address buffer receiving the address signals, the configurable address buffer operable in a first addressing configuration to output the address utilizing a first number of sets of the address signals, the configurable address buffer further operable in a second addressing configuration to output the address utilizing a second number of sets of the address signals; and
   a mode register operable to couple a control signal to the configurable address buffer, the control signal causing the configurable address buffer to operate according to the first or the second addressing configuration.

73. A configurable address buffer system operable to receive at least one set of address signals and output an address, the system comprising:
   a configurable address buffer receiving the address signals, the configurable address buffer operable in a first addressing configuration to output the address utilizing a first number of sets of the address signals, the configurable address buffer further operable in a second addressing configuration to output the address utilizing a second number of sets of the address signals; and
   one of a fuse and an anti-fuse operable to couple a control signal to the configurable address buffer, the control signal causing the configurable address buffer to operate according to the first or the second addressing configuration.

74. A memory device comprising:
an addressable array of memory cells; and
a configurable address buffer system coupled to the addressable array of memory cells, the configurable address buffer system operable to receive at least one set of address signals and output an address of a selected one of the memory cells, the configurable address buffer system comprising:
   a configurable address buffer, the configurable address buffer operable in a first addressing configuration to output the address utilizing one set of the address signals, the configurable address buffer further operable in a second addressing configuration to output the address utilizing two sets of the address signals; and
   an address configuration selector operable to couple a control signal to the configurable address buffer, the control signal causing the configurable address buffer to operate according to the first or the second addressing configuration.

75. A memory device comprising:
an addressable array of memory cells; and
a configurable address buffer system coupled to the addressable array of memory cells, the configurable address buffer system operable to receive at least one set of address signals and output an address of a selected one of the memory cells, the configurable address buffer system comprising:
a configurable address buffer, the configurable address buffer operable in a first addressing configuration to output the address utilizing a first number of sets of the address signals, the configurable address buffer further operable in a second addressing configuration to output the address utilizing a second number of sets of the address signals, the configurable address buffer comprising:
   a first decoder operable to receive address signals and output at least a portion of a row or column address;
   a second decoder operable to receive address signals and output at least a portion of a row or column address; and
   an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders; and
an address configuration selector operable to couple a control signal to the configurable address buffer, the control signal causing the configurable address buffer to operate according to the first or the second addressing configuration.

76. A memory device comprising:
an addressable array of memory cells; and
a configurable address buffer system coupled to the addressable array of memory cells, the configurable address buffer system operable to receive at least one set of address signals and output an address of a selected one of the memory cells, the configurable address buffer system comprising:
- a configurable address buffer, the configurable address buffer operable in a first addressing configuration to output the address utilizing a first number of sets of the address signals, the configurable address buffer further operable in a second addressing configuration to output the address utilizing a second number of sets of the address signals; and
- a mode register operable to couple a control signal to the configurable address buffer, the control signal causing the configurable address buffer to operate according to the first or the second addressing configuration.

77. The memory device of claim 76 wherein the configurable address buffer further comprises:
a first decoder operable to receive address signals and output at least a portion of a row or column address;
a second decoder operable to receive address signals and output at least a portion of a row or column address; and
an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders.

78. A memory device comprising:
an addressable array of memory cells; and
a configurable address buffer system coupled to the addressable array of memory cells, the configurable address buffer system operable to receive at least one set of address signals and output an address of a selected one of the memory cells, the configurable address buffer system comprising:
- a configurable address buffer, the configurable address buffer operable in a first addressing configuration to output the address utilizing a first number of sets of the address signals, the configurable address buffer further operable in a second addressing configuration to output the address utilizing a second number of sets of the address signals; and
- one of a fuse and an anti-fuse operable to couple a control signal to the configurable address buffer, the control signal causing the configurable address buffer to operate according to the first or the second addressing configuration.

79. The memory device of claim 78 wherein the configurable address buffer further comprises:
a first decoder operable to receive address signals and output at least a portion of a row or column address;
a second decoder operable to receive address signals and output at least a portion of a row or column address; and
an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders.

80. A computer system comprising:
a processor;
an input device coupled to the processor;
an output device coupled to the processor; and
a memory device coupled to the processor, the memory device comprising:
an addressable array of memory cells; and
a configurable address buffer system coupled to the addressable array of memory cells, the configurable address buffer system operable to receive at least one set of address signals and output an address of a selected one of the memory cells, the configurable address buffer system comprising:
- a configurable address buffer receiving the address signals, the configurable address buffer operable in a first addressing configuration to output the address utilizing one set of the address signals, the configurable address buffer further operable in a second addressing configuration to output the address utilizing two sets of the address signals; and
- an address configuration selector operable to couple a control signal to the configurable address buffer, the control signal causing the configurable address buffer to operate according to the first or the second addressing configuration.

81. The computer system of claim 80 wherein the address configuration selector comprises an externally applied mode select signal.

82. The computer system of claim 80 wherein the memory cells comprise dynamic random access memory cells.

83. A computer system comprising:
a processor;
an input device coupled to the processor;
an output device coupled to the processor; and
a memory device coupled to the processor, the memory device comprising:
an addressable array of memory cells; and
a configurable address buffer system coupled to the addressable array of memory cells, the configurable address buffer system operable to utilize a clock signal and to receive at least one set of address signals and output an address of a selected one of the memory cells, the configurable address buffer system comprising:
- a configurable address buffer receiving the address signals, the configurable address buffer operable in a first addressing configuration to output the address utilizing a first number of sets of the address signals, the configurable address buffer further operable in a second addressing configuration to output the address utilizing a second number of sets of the address signals, the address signals in each of the sets in the second number being received during successive clock periods; and an address configuration selector operable to couple a control signal to the configurable address buffer, the control signal causing the configurable address buffer to operate according to the first or the second addressing configuration.

84. The computer system of claim 83 wherein the configurable address buffer further comprises:
a first decoder operable to receive address signals and output at least a portion of a row or column address;
a second decoder operable to receive address signals and output at least a portion of a row or column address; and
an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders.

85. The computer system of claim 83 wherein the address configuration selector comprises an externally applied mode select signal.

86. A computer system comprising:
a processor;
an input device coupled to the processor;
an output device coupled to the processor; and
a memory device coupled to the processor, the memory device comprising:
an addressable array of memory cells; and
a configurable address buffer system coupled to the addressable array of memory cells, the configurable address buffer system operable to receive at least one set of address signals and output an address of a selected one of the memory cells, the configurable address buffer system comprising:
a configurable address buffer receiving the address signals, the configurable address buffer operable in a first addressing configuration to output the address utilizing a first number of sets of the address signals, the configurable address buffer further operable in a second addressing configuration to output the address utilizing a second number of sets of the address signals, the configurable address buffer comprising:
a first decoder operable to receive address signals and output at least a portion of a row or column address;
a second decoder operable to receive address signals and output at least a portion of a row or column address; and
an input buffer coupled to the first and second decoders, the input buffer operable in the first addressing configuration to receive at least a portion of the address signals in each of the first number of sets and to sequentially couple each of the received portions of the address signals in the first number of sets to the first decoder, the first input buffer operable in the second addressing configuration to receive at least a portion of the address signals in each of the second number of sets and alternately couple the received portions of the address signals in the second number of sets to the first and second decoders; and
an address configuration selector operable to couple a control signal to the configurable address buffer, the control signal causing the configurable address buffer to operate according to the first or the second addressing configuration.

87. A computer system comprising:
a processor;
an input device coupled to the processor;
an output device coupled to the processor; and
a memory device coupled to the processor, the memory device comprising:
an addressable array of memory cells; and
a configurable address buffer system coupled to the addressable array of memory cells, the configurable address buffer system operable to receive at least one set of address signals and output an address of a selected one of the memory cells, the configurable address buffer system comprising:
a configurable address buffer receiving the address signals, the configurable address buffer operable in a first addressing configuration to output the address utilizing a first number of sets of the address signals, the configurable address buffer further operable in a second addressing configuration to output the address utilizing a second number of sets of the address signals; and
a mode register operable to couple a control signal to the configurable address buffer, the control signal causing the configurable address buffer to operate according to the first or the second addressing configuration.

88. The computer system of claim 87 wherein the memory cells comprise dynamic random access memory cells.

* * * * *